United States Patent

Morse

Patent Number: 5,962,986
Date of Patent: Oct. 5, 1999

[54] SOLID STATE RF LIGHT DRIVER FOR ELECTRODELESS LIGHTING

[75] Inventor: Alfred W. Morse, Ellicott City, Md.

[73] Assignee: Northrop Grumman Corporation, Los Angeles, Calif.

[21] Appl. No.: 08/858,419

[22] Filed: May 19, 1997

[51] Int. Cl.⁶ .............................. H05B 4/00; H03B 5/00; H03B 5/08; H03B 5/30
[52] U.S. Cl. .............. 315/248; 315/344; 331/117 R; 331/107 SL; 331/117 FE; 331/116 R; 372/82
[58] Field of Search .............................. 315/248, 344; 331/107 SL, 117 R, 107 R, 116 R, 117 FE; 330/137; 372/37, 38, 82

[56] References Cited

U.S. PATENT DOCUMENTS

| | | | |
|---|---|---|---|
| 4,245,178 | 1/1981 | Justice | 315/248 |
| 4,473,732 | 9/1984 | Payne | 363/133 X |
| 4,602,221 | 7/1986 | Regan et al. | 331/117 R |
| 5,449,925 | 9/1995 | Baliga et al. | 257/77 |
| 5,541,482 | 7/1996 | Siao | 315/248 |
| 5,612,547 | 3/1997 | Clarke et al. | 257/77 |

*Primary Examiner*—Arnold Kinkead
*Attorney, Agent, or Firm*—Walter G. Sutcliff

[57] ABSTRACT

A transformerless power oscillator for driving a high intensity electrodeless light bulb. The driver uses a silicon carbide static induction transistor (SIT) operating as a power oscillator powered by an unregulated power supply potential generated by a full wave rectifier bridge connected to an AC power line. A CW output signal is generated at S-band and is coupled to the excitation coil of an electrodeless lamp by means of a matching network.

15 Claims, 1 Drawing Sheet

SOLID STATE RF LIGHT DRIVER FOR ELECTRODELESS LIGHTING

CROSS REFERENCE TO RELATED APPLICATIONS

This application is related to the following U.S. Patent Applications:

U.S. Ser. No. 08/708,447, "Static Induction Transistor", R. R. Siergiej et al, filed on Sep. 5, 1996 now U.S. Pat. No. 5,705,830; and U.S. Ser. No. 08/877,847, "Silicon Carbide Static Induction Transistor Structure", A. Argarwal et al, filed on Jun. 18, 1997.

These applications are assigned to the assignee of the subject application and are intended to be incorporated herein by reference.

BACKGROUND OF THE INVENTION

1. Field of the Invention

This invention relates generally to apparatus for exciting a light source and more particularly to solid state driver circuitry for exciting a high intensity electrodeless light bulb.

2. Description of Related Art

There has been a long term need for improved light sources for both commercial and industrial use. The key parameters sought are efficiency, light quality, reliability and low cost. Various light sources have been developed in the past which address various aspects of these needs. To date, however, no light source has been found to be optimum in all respects, and therefore a huge commercial market awaits new techniques which offer significant improvements.

One such light source comprises an RF excited electrodeless light bulb which consists of a closed transparent glass sphere filled with a proprietary gas. Typically, the bulb contains an inert gas, such as argon, and an element from Group VI-A of the Periodic Table of elements, such as sulfur. When the gas is excited by an RF field, it glows with an intense white light. The efficiency of light output per unit input power in such a light bulb is considerably higher than other types of light sources and the quality of the light is unsurpassed for its similarity to bright sunlight. Because the bulb is hermetic with no electrodes, its cost is trivial and its reliability and useful life are exceptional.

Currently, a 1000 watt electrodeless bulb manufactured by Fusion Lighting, Inc. is driven at an RF frequency, for example 2.45 GHz, using magnetrons developed for microwave ovens. Magnetrons, while being relatively low in cost, have a much lower life expectancy, typically 4000 hours, than the bulb itself. While this operational life is acceptable for intermittent food preparation, it is not acceptable for lighting applications.

Another known method of exciting these types of electrodeless light bulbs is by means of an electrical coil which is wound around the outside of the light bulb so as to generate an RF excitation field. The coil is coupled to a driver which typically includes a source of RF energy and an RF power amplifier coupled to the excitation coil by means of a matching network.

With respect to the RF source for the excitation coil, it has recently become practical to generate hundreds of watts at S-Band using transistors. While a solid state power source using commonly available transistors can satisfy the reliability requirements of such a light driver, it exhibits inherent limitations with respect to overall efficiency, size, and cost. Presently available semiconductor technology, based on silicon or GaAs, also requires an expensive power supply to convert the AC line to low voltage at high current. Furthermore, such low voltage devices have limited ruggedness and require strict isolation from power line variations or static transients. Also, extensive heat sinking is required to supply CW power in the 50 to 100 Watt range at, for example, 2.45 GHz, and extensive heat sinking is required to dissipate waste heat at reliable device temperatures. Silicon carbide devices, however, do not have such limitations.

In the above referenced related applications U.S. Ser. No. 08/708,447, now U.S. Pat. No. 5,705,830 and U.S. Ser. No. 08/877,847, and U.S. Pat. No. 5,612,547, entitled, "Silicon Carbide Static Induction Transistor And Method", which issued to R. C. Clarke et al on Mar. 18, 1997, there is disclosed the details of a static induction transistor fabricated in silicon carbide and which finds particular application in this invention.

SUMMARY

Accordingly, it is an object of the present invention to provide an improvement in high intensity light sources.

It is another object of the invention to provide an improvement in the means used to excite a high intensity electrodeless light bulb.

It is a further object of the invention to provide an improvement in the driver circuitry for a high intensity electrodeless light bulb.

It is yet a further object of the invention to provide a high frequency power source for a high intensity electrodeless light bulb which is low in cost, highly efficient, small in size and relatively simple in its implementation.

The foregoing and other objects of the invention are achieved by a transformerless power oscillator for driving a high intensity electrodeless light bulb using a silicon carbide static induction transistor (SIT) operating as a power oscillator off of an unregulated power supply potential and comprises a high voltage S-band static induction transistor powered from a full wave rectifier bridge connected to an AC power line. A rectified DC supply voltage is applied to the transistor which is connected in an oscillator circuit configuration such that its gate electrode is connected to the return side or ground side of the rectifier, the drain electrode is connected to the DC power supply potential by means of a first stripline impedance matching element and the source electrode is connected back to the return side of the rectifier by means of a second stripline impedance matching element and a series connected frequency determining element such as a variable capacitor. The DC supply potential is applied through an inductor which operates as a choke coil. A CW output signal is generated at S-band and is coupled to the excitation coil of an electrodeless lamp by means of a matching network.

Further scope of applicability of the present invention will become apparent from the detailed description provided hereinafter. It should be understood, however, that the detailed description and specific examples, while indicating preferred embodiments of the invention, are provided by way of illustration only, inasmuch as various changes and modifications coming within the spirit and scope of the invention will become apparent to those skilled in the art from this detailed description.

BRIEF DESCRIPTION OF THE DRAWINGS

The present invention will become more fully understood from the detailed description provided hereinafter and the accompanying drawings which are provided by way of illustration only, and thus are not meant to be limitative of the present invention, and wherein.

DETAILED DESCRIPTION OF THE INVENTION

Figure 1:
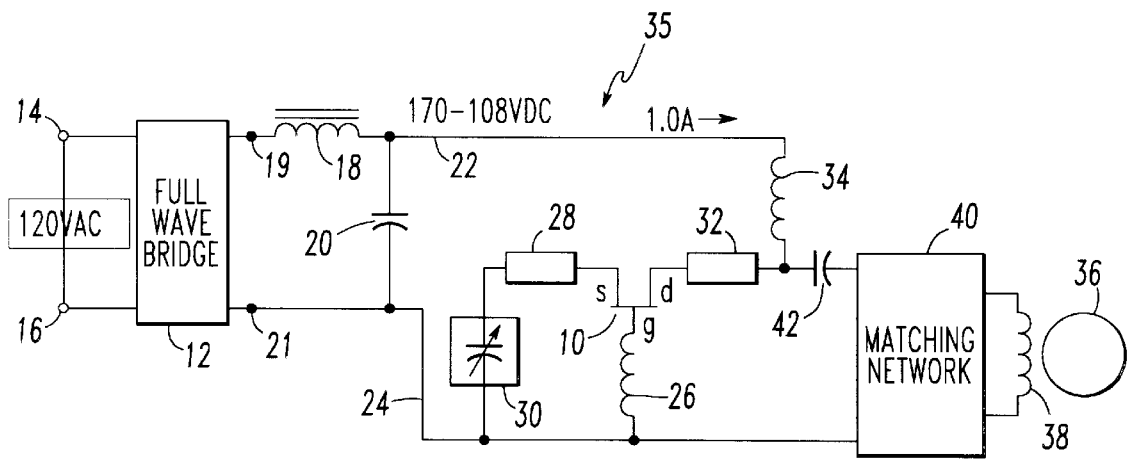
FIG. 1 is an electrical schematic diagram illustrative of the preferred embodiment of the invention.

Referring now to the drawings and more particularly to FIG. 1, reference numeral 10 denotes a field effect transistor having gate (g), source (s), and drain (d) electrodes, and more particularly a silicon carbide static induction transistor (SIT) which is capable of operating at S-band frequencies. Such a device has been developed by the present assignee and comprises a transistor which is significantly superior to prior art devices fabricated, for example, on silicon or gallium arsenide, particularly as it pertains to power, gain, operating voltage, efficiency and temperature tolerance. The details of a silicon carbide static induction transistor are furthermore disclosed in the above cross referenced related applications as well as U.S. Pat. No. 5,612,547.

The SIT 10 is powered by a DC supply voltage generated by a full wave rectifier bridge 12 which is connected to an AC power line voltage (120 VAC) shown in FIG. 1 applied across a pair of AC terminals 14 and 16. The DC output voltage from the bridge 12 is filtered by means of an L-C filter consisting of a series inductor 18 and a parallel capacitor 20 connected across a pair of output terminals 19 and 21. A pair of supply voltage leads 22 and 24 are connected across the capacitor 20, lead 22 being a positive (+) potential lead, while supply lead 24 is a reference or ground lead. The DC voltage which appears across leads 22 and 24 is from about 170 VDC at no load but drops down to about 108 VDC when loaded by the circuitry shown in FIG. 1. A SIT 10 used in connection with this invention has a nominal operating voltage of 108 V DC but has the capability to withstand transient voltages above 170 V DC. This occurs because silicon carbide S-band SITs can typically operate in the 80–100 V range, while having a breakdown voltage up to 350 V DC. This voltage capability can be increased as required for use with a transformerless power supply.

The SIT 10 as shown in FIG. 1 operates as a power oscillator by virtue of having its gate electrode (g) connected to the ground side lead 24 by means of an inductance reactance element 26, while the source (s) electrode is coupled to the ground side lead 24 by means of a length of stripline microwave transmission line 28, which acts as an impedance matching element, and a series connected frequency determining element 30, shown comprising a variable capacitive reactance. However, when desirable, the frequency determining element may be comprised of a resonator structure or crystal, not shown. The drain (d) electrode is connected to the power supply lead 22 by means of another length of stripline 32, which also acts as an impedance matching element, and a choke coil 34. The oscillator 35 configuration shown in FIG. 1 preferably operates at a frequency of 2450 MHz and can output, for example, at between 50 and 100 Watts of continuous (CW) power. A frequency of 900 MHz can also be implemented simply by changing component values in a well known manner.

This output is used to excite an electrodeless light bulb 36 which comprises a closed glass tube filled with a proprietary gas. Excitation, in this invention, is achieved by means of an RF coil 38 placed in close proximity to the bulb 36, such as being partially wrapped around it. The 2450 MHz signal generated by the power oscillator including the SIT 10, is coupled to the excitation coil 38 by means of a conventional matching network 40 and a coupling capacitor 42.

Silicon carbide transistors are known to tolerate high temperatures better than other semiconductor devices such as silicon, or GaAs transistors. For reliability, however, the temperatures need to be bounded by cooling.

Figure 2:
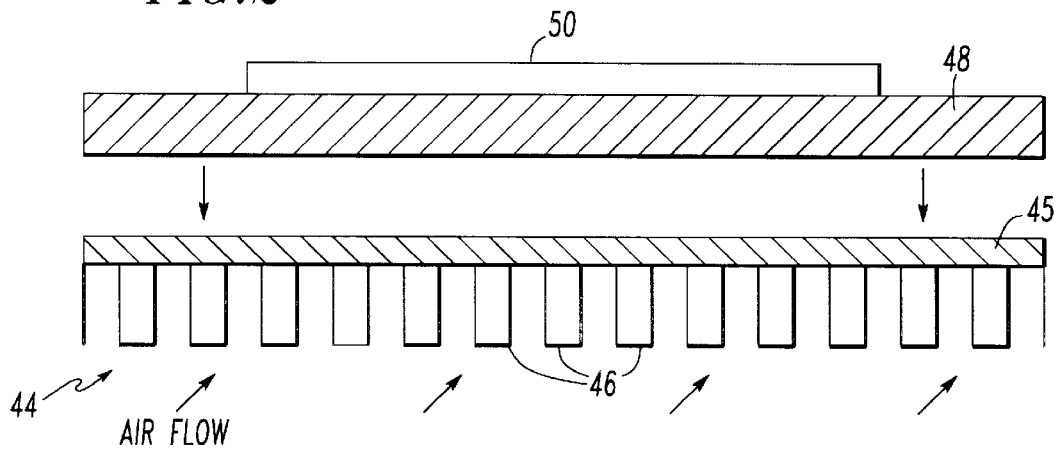
FIG. 2 is an exploded diagram illustrative of means used for cooling the embodiment shown in FIG. 1.

Since there is a need to hold the operating temperature of the SIT 10 from about 240° C. to 300° C., there is a need to provide some type of cooling for the circuitry shown in FIG. 1. Such cooling is provided by an air cooled finned heat exchanger 44 such as shown in FIG. 2, and where reference numeral 45 denotes a generally flat metal body member having a plurality of fins 46 secured to and extending from the underside thereof. The top of the body 44 is adapted to receive a metal mounting plate 48 for a semiconductor package 50 including the oscillator 35 shown in FIG. 1, exclusive of the excitation coil 38 and the light bulb 36.

Thus what has been shown and described is a transformerless power oscillator employing a silicon carbide static induction transistor which provides high efficiency and high gain at S-band without expensive in-package impedance matching and can provide over 50 Watts CW in a simple, single device circuit.

Having thus shown and described what is at present considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

I claim:

1. A solid state RF power oscillator connected to an AC power source for powering a high intensity electrodeless light bulb, comprising:

a rectifier circuit connected to the AC power source for converting an AC power line voltage to a DC supply voltage, said DC supply voltage being supplied across a first and second power supply terminal;

a relatively high voltage semiconductor device operable at microwave frequencies including first and second current conducting electrodes and a control electrode;

a first impedance matching element coupling the first current conducting electrode to the first power supply terminal;

an inductive reactance type of impedance element coupled between the first impedance matching element and the first power supply terminal;

a second impedance matching element and series connected frequency determining means coupling the second current conducting electrode to the second power supply terminal; and an inductive reactance type of impedance element coupling the control electrode to the second power supply terminal, whereby an RF power oscillator circuit is implemented which generates a CW power voltage for said electrodeless light bulb.

2. A power oscillator in accordance with claim 1 wherein said semiconductor device comprises a silicon carbide transistor.

3. A power oscillator in accordance with claim 2 wherein said silicon carbide transistor comprises a silicon carbide field effect transistor, and wherein said first and second current conducting electrodes comprise drain (d) and source (s) electrodes, respectively, and said control electrode comprises a gate(g) electrode.

4. A power oscillator in accordance with claim 3 wherein said silicon carbide field effect transistor comprises a silicon carbide static induction transistor (SIT).

5. A power oscillator in accordance with claim 4 wherein said first and second impedance matching elements are comprised of reactance type elements.

6. A power oscillator in accordance with claim 5 wherein said reactance type elements comprise lengths of stripline microwave transmission line.

7. A power oscillator in accordance with claim 5 wherein said frequency determining means comprises a capacitive reactance.

8. A power oscillator in accordance with claim 5 wherein said frequency determining means comprises a resonator means.

9. A power oscillator in accordance with claim 5 wherein said frequency determining means comprises a crystal.

10. A power oscillator in accordance with claim 1 and additionally including a coil coupled to said CW power voltage for exciting the electrodeless light bulb.

11. A power oscillator in accordance with claim 10 and additionally including an impedance matching network preceding said coil.

12. At A power oscillator in accordance with claim 4 and additionally including means for cooling the silicon carbide static induction transistor.

13. A power oscillator in accordance with claim 12 wherein said means for cooling comprises air cooled means.

14. A solid state RF power oscillator connected to an AC power source for generating CW power for driving a high intensity electrodeless light bulb, comprising:

a rectifier circuit connected to the AC power source for converting an AC power line voltage to a DC supply voltage supplied across first and second power supply terminals;

a single silicon carbide field effect transistor having gate (g), drain (d) and source (s) electrodes;

a first impedance matching element coupling the drain electrode (d) to the first power supply terminal;

a second impedance matching element and series connected frequency determining means coupling the source electrode (s) to the second power supply terminal; and an inductive reactance coupling the gate electrode (g) to the second power supply terminal, whereby an RF power oscillator circuit is implemented which generates CW power for exciting the electrodeless light bulb.

15. A power oscillator in accordance with claim 14 and additionally including a matching network coupled to said oscillator circuit and an RF excitation coil coupled to said matching network for generating an RF excitation field in response to said CW power applied to said matching network for exciting the electrodeless light bulb.

* * * * *